United States Patent [19]

Ogura et al.

[11] 3,920,484

[45] Nov. 18, 1975

[54] METHOD OF MANUFACTURING SEMICONDUCTOR DEVICE

[75] Inventors: Setsuo Ogura, Huchu; Naonobu Sato, Kodaira, both of Japan

[73] Assignee: Hitachi, Ltd., Japan

[22] Filed: Dec. 4, 1973

[21] Appl. No.: 421,651

[30] Foreign Application Priority Data

Dec. 6, 1972 Japan .............................. 47-121566

[52] U.S. Cl. .............................................. 148/1.5
[51] Int. Cl.$^2$ ........................................ H01L 21/00
[58] Field of Search .................................... 148/1.5

[56] References Cited

UNITED STATES PATENTS

| | | | |
|---|---|---|---|
| 3,749,610 | 7/1973 | Swann | 148/1.5 |
| 3,756,861 | 9/1973 | Payne | 148/1.5 |

*Primary Examiner*—Peter D. Rosenberg
*Attorney, Agent, or Firm*—Craig & Antonelli

[57] ABSTRACT

A method of manufacturing a metal-insulator-semiconductor field-effect transistor and a bipolar transistor within an identical semiconductor chip. At a part of a semiconductor layer whose impurity concentration is low and uniform, the collector region of the bipolar transistor is formed as has an impurity concentration higher than that of the semiconductor layer. The base region and the emitter region of the bipolar transistor are respectively formed within the collector region. In the low impurity concentration-semiconductor layer, which is made a channel-forming region of the field-effect transistor, source and drain regions of the field-effect transistor are respectively formed.

16 Claims, 8 Drawing Figures

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of forming a metal-insulator-semiconductor field-effect transistor (hereinbelow termed "MISFET") and a bipolar transistor on an identical semiconductor substrate. It is principally directed to an N-channel FET and an N-P-N transistor which are used in a high frequency tuner.

2. Description of the Prior Art

The MISFET has been employed recently as the first stage amplifier circuit of a high frequency tuner, since, with respect to the bipolar transistor, it has a better cross modulation ratio and improved stability. With a circuit employing particularly a dual gate MISFET, the feedback capacitance can be made small and, hence, an external neutralizing circuit is not specifically required. Moreover, since the apparent input capacitance due to the Miller effect is small, detuning upon the application of an AGC bias is essentially negligible. These merits render the tuner highly stable and easy to handle. With an FET, the operating region in which the linearity of $g_m$ is good can be readily selected, so that the cross modulation characteristic is also good. Further, when a dual gate FET as stated above is used as a mixer circuit for mixing local oscillation signals and received signals, the second gate is employed for injecting the local oscillation, whereby the injectiion power may be small, the linearity becomes good, and the stability for a large input signal becomes good.

These are the reasons why FETs have come into use as parts of a high frequency tuner circuit. Prior-art tuners, however, have had problems in that, since they are constructed of discrete components of both FETs and bipolar transistors, not only the manufacturing cost is high, but also the device becomes large in size.

In order to solve the problems, it would be desirable to construct the tuner into the form of an IC.

In building the tuner in IC form, elements constituting the circuit, such as MISFETs, bipolar transistors, diodes and resistances, are more desirably formed in an identical semiconductor chip.

It has been revealed that, a circuit a part of which employs a MISFET is to be formed into a semiconductor integrated circuit device, the following requirements must be satisfied in order to enhance the characteristics of the circuit device.

First, the bipolar transistor must have, for example, a collector saturation resistance $r_{sc}$ of a sufficiently small value in order to satisfactorily operate for the high frequency use. For this reason, it is necessary to make the specific resistance of the collector region small.

Next, in the MISFET, the specific resistance of a channel forming region for forming a channel in the surface must be made large in order to make small the stray capacitance created between a gate electrode and the channel forming region.

Thus, when the bipolar transistor and the MISFET are intended to be formed within the same semiconductor chip, the specific resistances of the regions in the respective elements must have the satisfactory values as described above.

For high frequency operation, the N-channel type MISFET and the N-P-N transistor in which electrons of great mobility are carriers are more desirable.

Also, unless the impurity concentration of the channel region of the MISFET is low to some extent, the bipolar effect in which the FET operates as a vertical type N-P-N transistor on account of noise voltages etc. arises as a problem in addition to the foregoing problem of the high frequency characteristic.

SUMMARY OF THE INVENTION

The present invention has been made in order to solve the problems stated above.

An object of the present invention is to provide a method of manufacturing a semiconductor device in the form of a bipolar transistor and a MISFET on the same substrate without degrading the electrical characteristics of the respective elements.

Another object of the present invention is to provide a method of manufacturing a semiconductor device which enhances the high frequency characteristic of the semiconductor device.

The fundamental construction of the present invention for accomplishing the objects is characterized by forming, at a part of a semiconductor layer which has a low impurity concentration and whose concentration distribution is substantially uniform, a collector region of a bipolar transistor which has an impurity concentration higher than that of the semiconductor layer. A base region and an emitter region are formed within the collector region, respectively, and source and drain regions of an FET are formed within the low impurity concentration semiconductor layer, respectively, the semiconductor layer constituting a channel forming region of the FET.

Another construction of the present invention is characterized, in the above fundamental construction, by making the semiconductor conductivity type of the collector region and that of the channel forming region opposite one another.

BRIEF DESCRIPTION OF THE DRAWING

FIGS. 1 to 8 illustrate various steps of manufacture in an embodiment of the present invention, among which FIGS. 1 to 4 are sectional views, while FIGS. 5–8 are enlarged sectional views.

DESCRIPTION OF THE PREFERRED EMBODIMENT

With reference to FIGS. 1 to 8 showing various steps of manufacture, description will be made of an embodiment of a method of forming an N-P-N bipolar transistor and an N-channel MISFET on the same semiconductor substrate.

Figure 1:
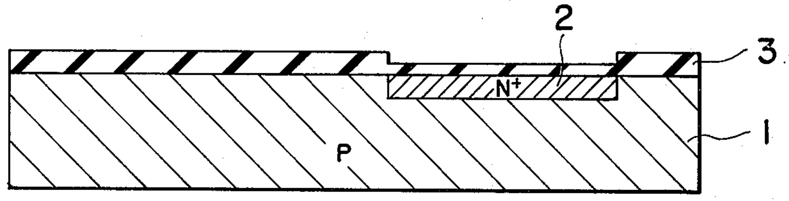

First as shown in FIG. 1, an oxide film 3 formed on a P-type silicon semiconductor substrate 1 by the thermal oxidation of the substrate is selectively removed by photoetching. Subsequently, using the oxide film 3 as a mask, a buried layer 2 of $N^+$-type is formed in the surface of the substrate 1 by selective diffusion.

Figure 2:
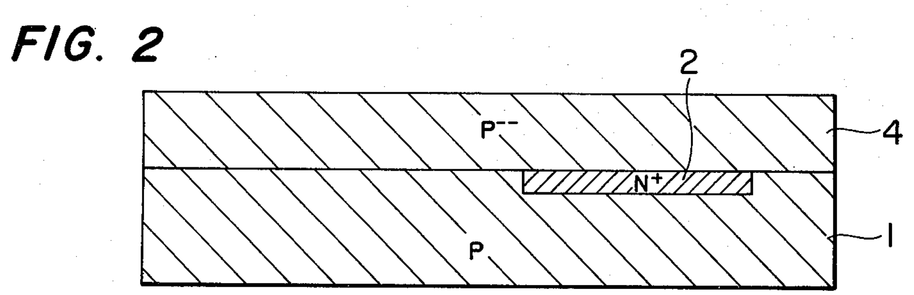

Next, as illustrated in FIG. 2, the oxide film 3 on the substrate 1 is entirely removed. An epitaxial (silicon single crystal) layer 4 of the $P^{--}$-type is grown on the resultant substrate. In forming the epitaxial layer 4, since the impurity concentration of the layer 4 is low, the vicinity of the interface between the substrate 1 and the layer 4 is sometimes converted into N-conductivity type on account of N-type impurity atoms which diffuse out of the $N^+$-type buried layer 2. In such a case, it is desirable to previously form a $P^+$-type buried layer in the surface of the substrate 1 around the $N^+$-type buried layer 2.

Figure 3:
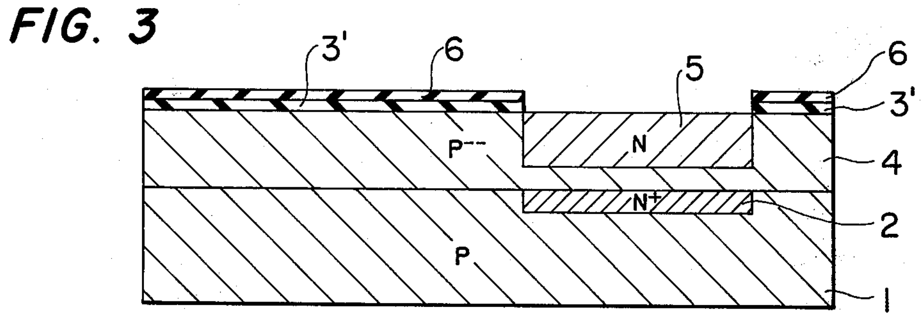

Then, as shown in FIG. 3, on an oxide film 3' produced anew on the layer 4, a photoresist film 6 is formed. The oxide film 3' and the photoresist film 6, which overlie the buried layer 2, are selectively removed. Thereafter, using as a mask the oxide film 3' and the photoresist film 6 remaining on the layer 4, phosphorus, for example, is introduced into the layer 4 by the ion implantation to thus form a phosphorus doped layer 5 of N-type. Unlike the thermal diffusion technique for the impurity, the ion implanation technique permits the impurity concentration distribution in the layer 5 to be appropriately varied. In the embodiment, the impurity concentration in the layer 5 is made substantially uniform.

Figure 4:
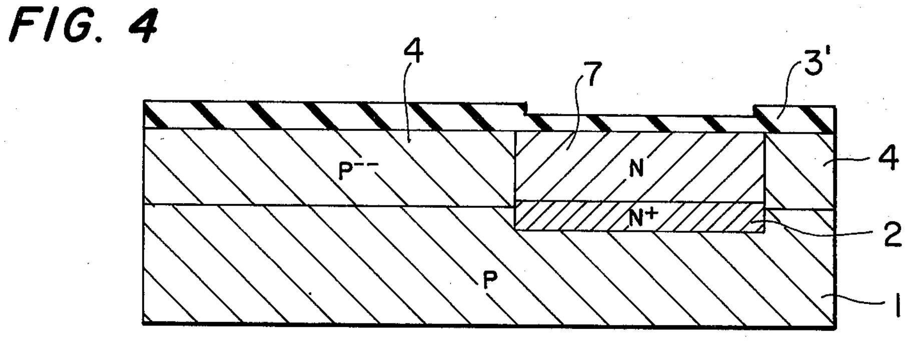

The resultant substrate 1 is heated in an oxidizing atmosphere. Then, as depicted in FIG. 4, the impurities are diffused from the buried layer 2 and the N-type layer 5 within the substrate, to form an $N^-$-type semiconductor region 7 whose impurity concentration is higher than that of the $P^{--}$-type layer 4 and whose impurity concentration distribution is comparatively uniform. The region 7 is made an $N^-$-type collector region.

Figure 5:
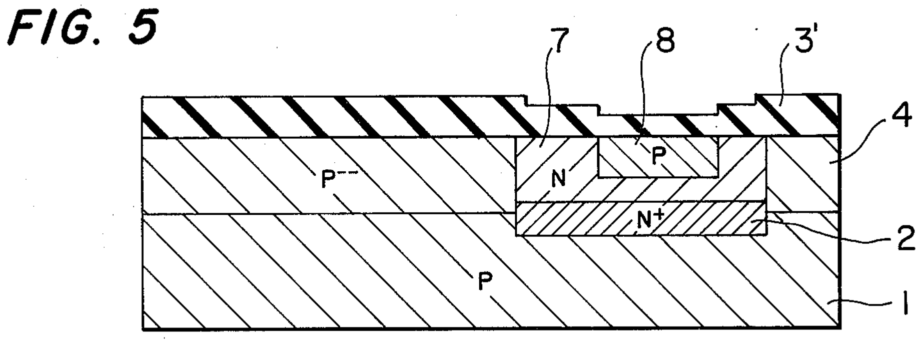

In order to form a P-type base region 8, shown in FIG. 5, within the $N^-$-type collector region 7, the oxide film 3' is selectively etched and removed by photoresist techniques, and boron, for example, is diffused into region 7.

Figure 6:
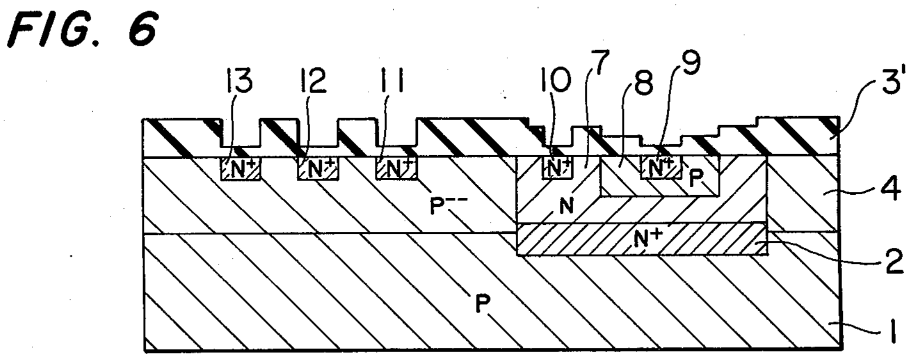

Next, as shown in FIG. 6, in order to form an $N^+$-type emitter region 9 within the base region 8, an electrode leading-out $N^+$-type region 10 within the collector region 7, and source and drain regions 11 – 13 at another part of the layer 4, respectively, the oxide film 3' is selectively etched and removed by photoresist techniques. A substance, such as phosphorus, forming an N-type semiconductor region is diffused with the oxide film 3' employed as a mask, to form the emitter region 9, the collector electrode leading-out layer 10, the drain 11, the source 11, drain 12 and the source 13 at the same time.

Figure 7:
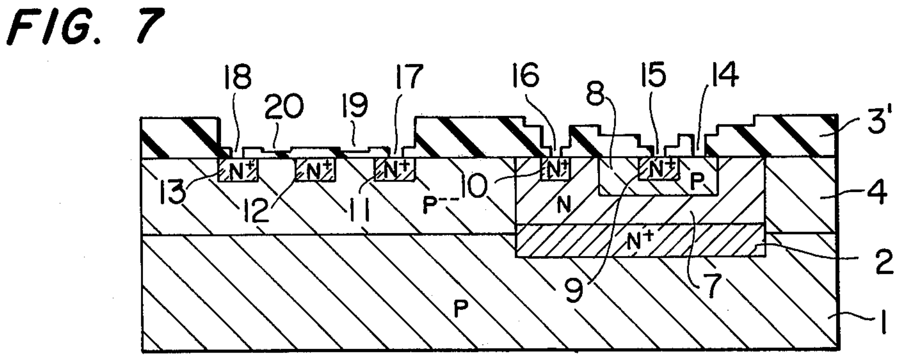

The oxide film 3' corresponding to the channel portions of the FET is removed by similar techniques. Subsequently, silicon oxide films 19 and 20 of a thickness of approximately 1,000 A are formed at the channel portions, as depicted in FIG. 7. Thereafter, as electrode leading-out openings for the bipolar transistor and the FET constructed on the substrate (EP layer), selective openings of an emitter opening 15, a base opening 14, a collector opening 16, a drain opening 17 and a source opening 18 are respectively formed in the oxide film 3'.

Figure 8:
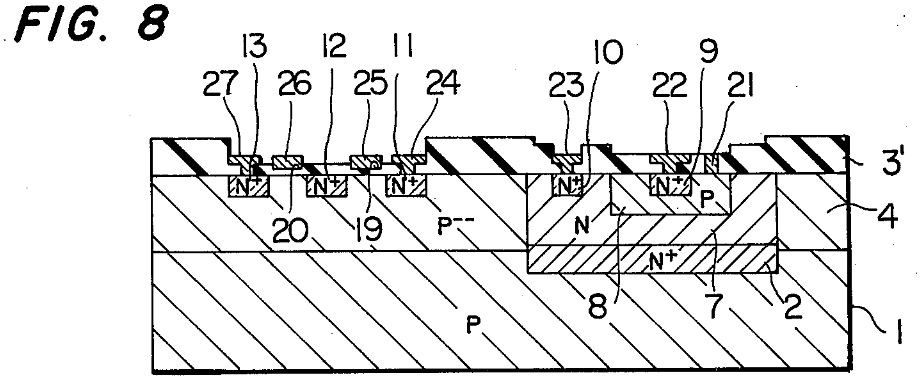

On the resultant substrate, there is formed a conductor layer of, for example, aluminum. The part of the conductor layer other than parts necessary as electrodes is removed, to form an emitter electrode 22, a base electrode 21, a collector electrode 23, a drain electrode 24, gate electrodes 25 and 26, and a source electrode 27, respectively as shown in FIG. 8.

The MISFET according to the embodiment is of the dual gate type which has excellent high frequency characteristics.

In addition to the foregoing embodiment, the present invention has the aspects of performance as mentioned below.

1. The semiconductor oxide film formed on the semiconductor layer in the process of the embodiment is formed, not by thermal oxidation, but by an LTP method (low temperature processing-oxide film forming method) or other deposition processes using various deposition sources as described in U.S. Pat. No. 3,089,793.

2. The impurity diffusion may also be carried out by combining the thermal diffusion, the ion implantation etc.

3. When, in the method of forming the FET and the bipolar transistor in the identical chip, the combination between the FET and the bipolar transistor comprises, not the exemplified N-channel FET and N-P-N transistor, but a P-channel FET and an N-P-N transistor, a P-channel FET and a P-N-P transistor, or an N-channel FET and a P-N-P transistor, the method can be performed by appropriately selecting the conductivity types of the respective regions indicated in the foregoing embodiment.

According to the present invention as explained above in connection with the embodiment, its objects can be accomplished and its effects can be achieved as explained below.

Since the channel region of the MISFET is formed from the epitaxial layer, the impurity concentration can be made sufficiently low and set at a uniform distribution. The collector layer of the bipolar transistor is so constructed as to have a higher impurity concentration than the channel region. Since, accordingly, the region of the higher impurity concentration is formed in the region of the lower impurity concentration, the formation of the collector region in the epitaxial layer can be easily effected. Therefore, the present invention makes it possible, by setting the impurity concentration of the channel region at a sufficiently low value, to form within the same chip an N-channel MISFET for high frequencies, and an N-P-N bipolar transistor which has a collector region of comparatively high impurity concentration, so that the collector saturation resistance is low and that it is isolated from the other element by the collector region, making any special isolation region unnecessary.

The present invention is mainly applicable to a tuner for high frequencies, various other tuners, and where an FET and a bipolor transistor are to be formed on the same substrate.

While we have shown and described only one embodiment in accordance with the present invention, it is understood that the same is not limited thereto but is susceptible of numerous changes and modifications as known to those skilled in the art, and we therefore do not wish to be limited to the details shown and described herein but intend to cover all such changes and modifications as are obvious to one of ordinary skill in the art.

What we claim is:

1. A method of manufacturing a semiconductor device comprising the steps of:

a. providing a semiconductor substrate of a first conductivity type, at least a portion of which has a substantially uniform impurity concentration extending from a first surface to a prescribed depth therefrom;

b. forming, in a selected first portion of the substantially uniform impurity concentration portion of said substrate, a collector region by introducing impurities of a second conductivity type, opposite said first conductivity type, into said selected first portion of the substrate;

c. forming a base region in said collector region by introducing impurities of said first conductivity type into a prescribed portion of said collector region;

d. forming an emitter region in said base region by introducing impurities of said second conductivity type into a predetermined portion of said base region; and e. forming respective source and drain regions of a field-effect transistor within a selected second portion of the substantially uniform impurity concentration portion of said substrate, spaced apart from the first portion thereof, by introducing impurities of said second conductivity type into respective surface portions of said selected second portion of said substrate, said substrate constituting a channel-forming region of said field-effect transistor.

2. A method according to claim 1, wherein step (a) comprises the steps of:

a1. forming a buried region of said second conductivity type in a first semiconductor substrate layer of said first conductivity type, by introducing impurities of said second conductivity type in a surface portion of said first semiconductor substrate layer; and a2. epitaxially growing a second semiconductor substrate layer of said first conductivity type on the surface of said first semiconductor substrate layer, said second layer having a substantially uniform impurity concentration therethrough;

said first and second semiconductor substrate layers constituting said substrate and said selected first portion of said substrate overlying said buried region.

3. A method according to claim 2, wherein said buried region is formed to have an impurity concentration higher than that of said collector region.

4. A method according to claim 2, wherein said step (b) comprises:

b1. selectively introducing impurities of said second conductivity type into said second semiconductor substrate layer at said selected first portion thereof, to a prescribed depth, less than the thickness of said second semiconductor substrate layer, to form an initial collector region; and b2. heating the resulting structure to diffuse impurities from said initial collector region and said buried region into said second semiconductor substrate layer toward each other, to form a collector region which extends to and is contiguous with said buried region.

5. A method according to claim 1, wherein steps (d) and (e) are carried out simultaneously.

6. A method according to claim 2, wherein step (a) further includes the step of a3. forming a buried region of said first conductivity type in the portion of said first semiconductor layer surrounding the buried region of said second conductivity type.

7. A method according to claim 1, wherein said collector region is formed to have an impurity concentration relatively higher than that of said substantially uniform impurity concentration portion of said substrate.

8. A method of manufacturing a semiconductor device comprising the steps of:

a. providing a semiconductor substrate of a first conductivity type at least a portion of which has a substantially uniform impurity distribution therethrough;

b. implanting ions of a second conductivity type impurity into a selected first portion of said semiconductor substrate to form a semiconductor collector region of a bipolar transistor, said collector region having an impurity concentration higher than that of said semiconductor substrate;

c. forming a semiconductor base region of said first conductivity type within said collector region;

d. forming a semiconductor emitter region of said second conductivity type in said base region; and e. forming respective semiconductor source and drain regions of said second conductivity type of a field-effect transistor within a selected second portion of said semiconductor substrate, spaced apart from said first portion thereof, said semiconductor substrate constituting a channel-forming region of said field-effect transistor.

9. A method according to claim 8, wherein said step (a) comprises the steps of:

a1. forming a buried region of said second conductivity type in a semiconductor substrate of said first conductivity type at said selected first portion of said substrate; and a2. expitaxially growing a semiconductor layer of said first conductivity type and a substantially uniform impurity concentration on the surface of said substrate.

10. A method according to claim 9, further including the step of a3. forming a buried layer of said first conductivity type and a higher impurity concentration than said substrate in the surface of said substrate surrounding said buried region, prior to said step (a2).

11. A method according to claim 8, wherein said step (b) comprises the steps of b1. selectively forming an insulating masking layer on the surface of said semiconductor substrate, exposing the surface thereof at said selected first portion, and b2. implanting ions of said second conductivity type into said semiconductor substrate, to form said collector region.

12. A method according to claim 9, wherein said step (b) comprises the steps of b1. selectively introducing impurities of said second conductivity type into said semiconductor layer at said selected first portion thereof, to a prescribed depth, less than the thickness of said semiconductor layer to form an initial collector region; and b2. heating the resulting structure to diffuse impurities from said initial collector region and said buried region into said semiconductor layer toward each other, to form a collector region which extends to and is contiguous with said buried region.

13. A method according to claim 12, wherein said step (b1) comprises the steps of:

b1–1. selectively forming an insulating masking layer on the surface of said semiconductor layer, exposing the surface thereof at said selected first portion, and b1–2. implanting ions of said second conductivity type into said semiconductor layer, to form said collector region.

14. A method according to claim 8, wherein said steps (d) and (e) are carried out simultaneously.

15. A method according to claim 14, further comprising the step of forming an insulating film on the surface of said substrate and providing both a gate electrode thereon and electrode contacts for said source, drain, emitter, base and collector regions therethrough.

16. A method according to claim 13, further including the step of (a3) forming a buried layer of said first conductivity type and a higher impurity concentration than said substrate in the surface of said substrate surrounding said buried region, prior to said step (a2).

* * * * *